United States Patent
Berthel et al.

(10) Patent No.: US 7,808,853 B2
(45) Date of Patent: Oct. 5, 2010

(54) SEMICONDUCTOR MEMORY DEVICE AND METHOD WITH A CHANGEABLE SUBSTRATE POTENTIAL

(75) Inventors: Marc Berthel, Dresden (DE); Axel Strobel, Dresden (DE); Dominique Savignac, Ismaning (DE); Helmut Schneider, Munich (DE)

(73) Assignee: Qimonda AG, Munich (DE)

( * ) Notice: Subject to any disclaimer, the term of this patent is extended or adjusted under 35 U.S.C. 154(b) by 100 days.

(21) Appl. No.: 12/032,336

(22) Filed: Feb. 15, 2008

(65) Prior Publication Data

US 2008/0198676 A1      Aug. 21, 2008

(30) Foreign Application Priority Data

Feb. 15, 2007   (DE) ............ 10 2007 007 565

(51) Int. Cl.
*G11C 7/00* (2006.01)
*G11C 5/14* (2006.01)
(52) U.S. Cl. .................. 365/205; 365/189.09
(58) Field of Classification Search ............ 365/189.09, 365/205
See application file for complete search history.

(56) References Cited

U.S. PATENT DOCUMENTS

| | | | | |
|---|---|---|---|---|
| 4,692,642 | A * | 9/1987 | Fukuzo et al. | 327/57 |
| 5,177,586 | A * | 1/1993 | Ishimura et al. | 257/368 |
| 5,412,605 | A * | 5/1995 | Ooishi | 365/203 |
| 5,461,338 | A * | 10/1995 | Hirayama et al. | 327/534 |
| 5,477,498 | A * | 12/1995 | Ooishi | 365/208 |
| 5,646,900 | A | 7/1997 | Tsukude et al. | |
| 6,104,655 | A * | 8/2000 | Tanoi et al. | 365/205 |
| 6,407,956 | B2 * | 6/2002 | Ooishi | 365/205 |
| 7,113,425 | B2 * | 9/2006 | Cho et al. | 365/177 |
| 7,548,476 | B2 * | 6/2009 | Savignac et al. | 365/207 |
| 2001/0015930 | A1 | 8/2001 | Ooishi | |
| 2001/0024383 | A1 * | 9/2001 | Hidaka et al. | 365/189.11 |
| 2002/0122344 | A1 * | 9/2002 | Takemura et al. | 365/205 |
| 2006/0192595 | A1 * | 8/2006 | Schnabel et al. | 327/51 |

* cited by examiner

*Primary Examiner*—Son L Mai
(74) *Attorney, Agent, or Firm*—Dicke, Billig & Czaja, PLLC (57) ABSTRACT

A semiconductor memory device and method with a changeable substrate potential. One embodiment provides for operating a semiconductor memory device having at least one read or write/sense amplifier. The method includes changing the substrate potential of the read or write/sense amplifier.

21 Claims, 5 Drawing Sheets

SEMICONDUCTOR MEMORY DEVICE AND METHOD WITH A CHANGEABLE SUBSTRATE POTENTIAL

CROSS-REFERENCE TO RELATED APPLICATIONS

This Utility Patent Application claims priority to German Patent Application No. DE 10 2007 007 565.2 filed on Feb. 15, 2007, which is incorporated herein by reference.

BACKGROUND

The invention relates to a semiconductor memory device, and to a method for operating a semiconductor memory device.

In DRAMs, the respective memory cells may, for instance, consist substantially of capacitors. The memory cells/capacitors are adapted to be connected with bit lines that serve to transmit a data value that is to be read out from the memory cell, or a data value that is to be read into the memory cell.

During the reading out from a memory cell, an access transistor that is connected with the capacitor of a memory cell is connected through by the activation of a word line, and the charge state stored in the capacitor is applied to the bit line.

Then, the weak signal emanating from the capacitor is amplified by a read or write/sense amplifier. The read or write/sense amplifier includes complementary signal inputs. The bit lines connected with these signal inputs are referred to as bit line and complementary bit line.

In today's DRAMs, "shared sense amplifiers" may be used as read or write/sense amplifiers so as to save chip space. In so doing, a read or write/sense amplifier is used both during the reading out of a memory cell at the left side and of a memory cell at the right side along respective bit lines that are associated with a read or write/sense amplifier.

Prior to the reading out of the memory cells, the corresponding bit line sections, i.e. the corresponding sections of the non-complementary bit line and of the complementary bit line, are precharged to the same potential by using precharge/equalize circuits that are connected with the bit lines. This potential may, for instance, correspond to half the voltage of a bit line in a logic high state (i.e. VBLH/2). This ensures that—prior to the reading out of data—no differences occur between the potential of the section of the bit line and the section of the corresponding complementary bit line, which could otherwise overlay the small quantity of charge that is transmitted by the capacitor of a memory cell to the bit lines during the reading out. Directly prior to the reading out of the memory cells, the precharge/equalize circuits that are connected with the bit line sections that are associated with the memory cell to be read out are switched off.

Known DRAMs include additionally isolation circuits with isolation transistors which serve to disconnect the read or write/sense amplifier during the reading out of the memory cells from the side/the bit line sections that is/are not connected with the memory cells to be read out.

Each isolation circuit may, for instance, consist of two NMOS-FETs, the source drain paths of which are adapted to interrupt the corresponding bit line sections.

In the known DRAMs, appropriate bias voltages are applied to the gates of the isolation transistors of the isolation circuits beyond the read and write cycles. These bias voltages may, for instance, correspond to a voltage (VINT) generated internally in the DRAM device.

Directly prior to the reading out of a memory cell, that side of the read or write/sense amplifier that is connected with the memory cells that are not to be read out is uncoupled from the corresponding bit line section(s) in that the gates of the corresponding isolation transistors which are positioned on this side of the read or write/sense amplifier are grounded. At the same time, the other side of the read or write/sense amplifier can be coupled with the corresponding bit line section(s) in an improved manner in that the gate voltage that is applied to the gates of the isolation transistors which are positioned at the other side of the read or write/sense amplifier is, for instance, increased from the above-mentioned initial value VINT, to a voltage value VPP.

The actual reading out of the memory cell is initiated shortly thereafter in that corresponding word line signals connect through the access transistors that are connected with the memory capacitors. Then, corresponding activation voltages are applied to the read or write/sense amplifier, whereupon the read or write/sense amplifier amplifies the potential differences that are transmitted by the memory capacitors to the corresponding bit line sections, and outputs a correspondingly amplified differential signal.

The correspondingly amplified differential signal is transmitted by the read or write/sense amplifier to corresponding local data lines, wherein the local data lines are adapted to be coupled to the read or write/sense amplifiers by using corresponding transistors ("bit switches").

To connect the local data lines with the read or write/sense amplifier, a control signal CSL applied to the gate of the above-mentioned transistors (bit switches) is placed in a logic high state (e.g., the above-mentioned voltage VINT), so that the corresponding transistors (bit switches) are connected through.

The above-mentioned amplified differential signal is transmitted by the local data lines to corresponding global data lines and, for further amplification, to a further sense amplifier (so-called "secondary sense amplifier").

The driver circuit for the above-mentioned control signal CSL applied to the gate of the above-mentioned transistors (bit switches) may be a simple inverter that enables the switching of the CSL signal between e.g., 0 V and e.g., VINT.

For the above-mentioned reading out of memory cells ("read access"), both local data lines (e.g., called LocalDataLine_t and LocalDataLine_c) that are associated with a corresponding read or write/sense amplifier may first of all be precharged to a voltage level of, for instance, VBLH (wherein VBLH is, for instance, smaller than VINT).

If CSL is activated, a first one of the above-mentioned local data lines (e.g., LocalDataLine_c) may—depending on the state of the read or write/sense amplifier—slowly be discharged by the corresponding bit switch transistor, wherein the resulting differential signal (as mentioned above) is transmitted to the above-mentioned global data lines and to the above-mentioned further amplifier (secondary sense amplifier).

In order to write data in the memory cells ("write access"), for instance, in order to write a "0", a second one of the above-mentioned local data lines (e.g., LocalDataLine_t) that is associated with the above-mentioned read or write/sense amplifier may, for instance, be set to 0 V while the other one of the above-mentioned local data lines (e.g., LocalDataLine_c) continues to be kept on the above-mentioned precharge voltage level of, for instance, VBLH.

The logic low voltage level of the above-mentioned LocalDataLine_t is applied to a corresponding bit line of the bit line pair which is associated with the corresponding read or write/ sense amplifier, which results in that the read or write/sense amplifier switches over or tilts, respectively.

In the case of conventional DRAMs, a constant, unchanged substrate potential is used for the transistors available in the read or write/sense amplifier during the operation of the read or write/sense amplifier or during the above-mentioned write/read cycles, respectively.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide a semiconductor device, in one embodiment a DRAM, and a method for operating a semiconductor device, in one embodiment a memory device.

In accordance with one embodiment there is provided a semiconductor memory device including at least one read or write/sense amplifier with a substrate potential that is adapted to be changed in the course of an activation cycle or a read and/or write cycle, respectively.

In one embodiment, the substrate potential may be switched between a first predetermined potential and a second predetermined potential.

The first predetermined potential may, for instance, be a positive potential, and the second predetermined potential may be a negative potential.

Thus, it may be achieved, for instance, that the read or write/sense amplifier operates relatively quickly, and that the leaking currents are nevertheless kept relatively small.

Figure 1:
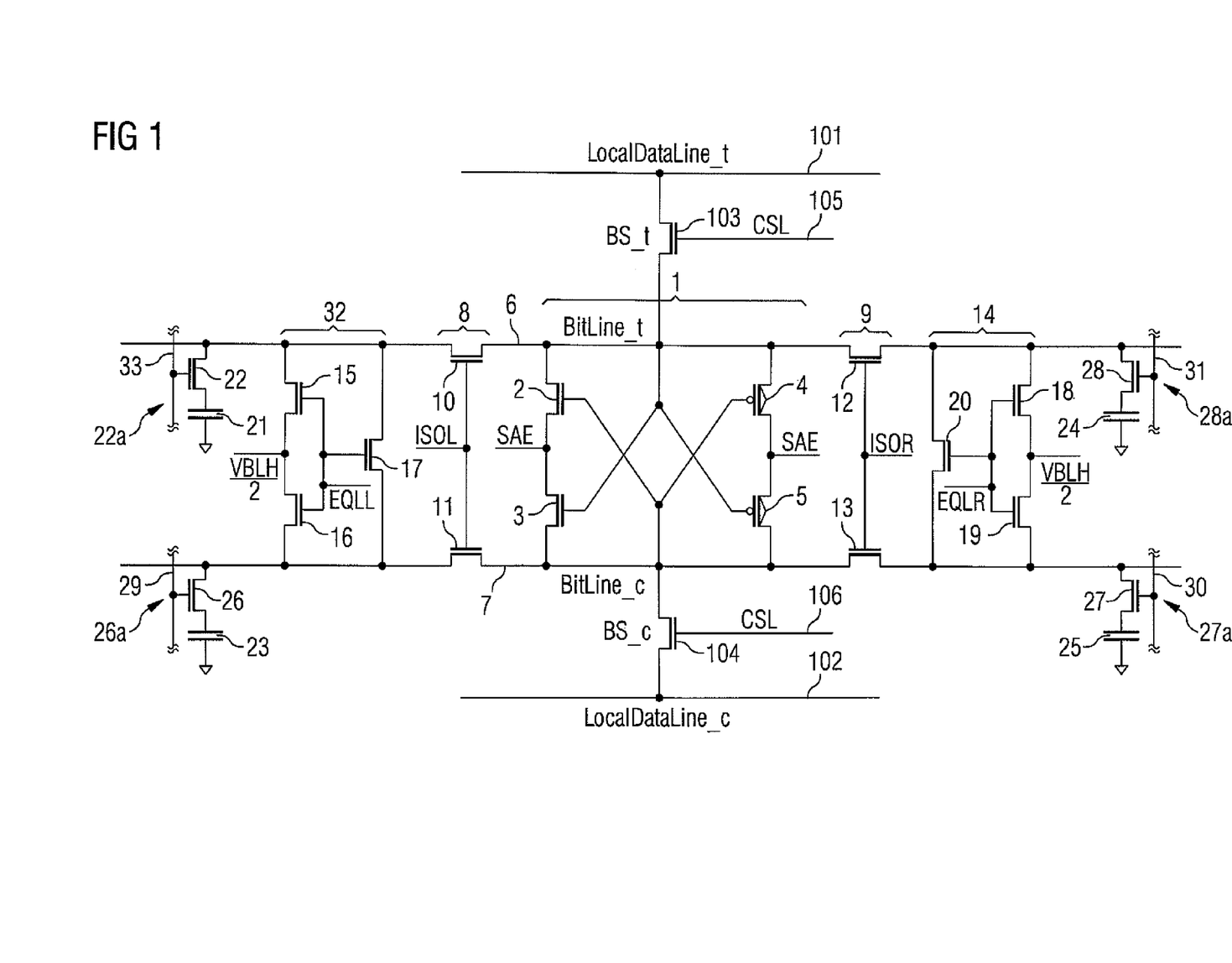
FIG. 1 illustrates a schematic detailed representation of the structure of a partial section of a semiconductor memory device in which a read or write/sense amplifier in accordance with one embodiment may be used.

FIG. 1 illustrates schematically a partial section of a semiconductor memory device, in one embodiment a DRAM (Dynamic Random Access Memory).

The semiconductor memory device includes a read or write/sense amplifier 1 that consists, for instance, of two NMOS-FETs 2 and 3, and two PMOS-FETs 4 and 5, which are connected with each other in the manner of a flip-flop.

One end of the source drain path of the first NMOS-FET 2 is connected with a bit line 6 (BitLine_t). Moreover, the gate of the first NMOS-FET 2 is connected with a further bit line 7 (BitLine_c) that is complementary to the bit line 6. Furthermore, the other end of the source drain path of the first NMOS-FET 2 is connected with an end of the source drain path of the second NMOS-FET 3, the source drain path of which is connected at its other end with the complementary bit line 7. Moreover, the gate of the second NMOS-FET 3 is connected with the bit line 6.

One end of the source drain path of the first PMOS-FET 4 is connected with the bit line 6. Moreover, the gate of the first PMOS-FET 4 is connected with the complementary bit line 7. Furthermore, the other end of the source drain path of the first PMOS-FET 4 is connected with an end of the source drain path of the second PMOS-FET 5, the source drain path of which is connected at its other end with the complementary bit line 7. Moreover, the gate of the second PMOS-FET 5 is connected with the bit line 6.

If the read or write/sense amplifier 1 is activated, corresponding voltages SAE (for example, voltages SAEN or SAEP, as is, for instance, illustrated in FIG. 1) are applied to the connecting points of the source drain paths of the two NMOS-FETs 2 and 3 and of the two PMOS-FETs 4 and 5.

The read or write/sense amplifier 1 is at the left and at the right connected with an isolation circuit 8 or 9, respectively. The isolation circuits 8 and 9 each consist of two NMOS-FETs 10, 11 or 12, 13, the source drain paths of which are adapted to interrupt the bit lines 6 and 7 so as to uncouple the side of the read or write/sense amplifier 1 during the reading out of date from or the writing of data into the memory cells that are positioned at the respectively other side of the read or write/sense amplifier 1.

The gates of the NMOS-FETs 10, 11 or 12, 13 of the isolation circuits 8, 9 that are connected with each other may be controlled via a control voltage ISOL (in the case of the isolation circuit 8 at the left side of the read or write/sense amplifier 1) or a control voltage ISOR (in the case of the isolation circuit 9 at the right side of the read or write/sense amplifier 1).

The DRAM section illustrated in FIG. 1 includes in addition two precharge/equalize circuits 32 and 14 that are illustrated in FIG. 1 at the left and right sides next to the isolation circuits 8 and 9. The precharge/equalize circuits 32 and 14 serve to charge the sections of the bit line 6 and of the complementary bit line 7 prior to the reading out of data from or the writing of data into a memory cell to the same voltage, e.g., a voltage corresponding to half the voltage of a bit line in a logic high state (VBLH/2).

Each precharge/equalize circuit 32, 14 consists of three NMOS transistors 15, 16, 17 or 18, 19, 20. The source drain path of a first one of the three NMOS transistors 17 or 20 of a precharge/equalize circuit 32, 14 is connected between the bit line 6 and the complementary bit line 7. The source drain paths of the two other NMOS transistors 15, 16 or 18, 19 are connected in series, wherein the series connection is also connected between the bit line 6 and the complementary bit line 7. As results from FIG. 1, the above-mentioned voltage VBLH/2 is present at the connecting point of the source drain paths of the two NMOS transistors 15, 16 or 18, 19. The gates of the three NMOS-FETs 15, 16, 17 or 18, 19, 20 of the precharge/equalize circuits 32, 14 are connected with each other and with a control voltage EQLL or EQLR that is fed by a control circuit (not illustrated in FIG. 1) so as to switch the precharge/equalize circuits 32, 14 on and off.

As may be seen from FIG. 1, a plurality of memory cells 22a, 26a, 27a, 28a (as well as further memory cells not illustrated in FIG. 1) are connected with each of the bit lines 6 and 7. The memory cells 22a, 26a, 27a, 28a each include a memory capacitor 21, 23, 24, 25 that is adapted to be connected with the bit lines 6 or 7 via the source drain path of a corresponding access transistor 22, 26, 27, 28 that consists of an NMOS-FET.

The access transistors 22, 26, 27, 28 may be controlled via corresponding word lines 29, 30, 31, 33.

As is further illustrated in FIG. 1, a first local data line 101 ("LocalDataLine_t") may, via the source drain path of a corresponding transistor 103 ("bit switch") (here: an NMOS-FET BS_t), be connected with the bit line 6, and a second local data line 102 ("LocalDataLine_c") may, via the source drain path of a corresponding transistor 104 ("bit switch") (here: an NMOS-FET BS_c), be connected with the complementary bit line 7.

The transistors 103, 104 may be switched on and off by applying a corresponding control signal CSL to the gates of the transistors 103, 104 (e.g., via pairs of CSL control lines 105, 106) (so that the bit lines 6, 7 are connected with the local data lines 101, 102/disconnected from the local data lines 101, 102).

Figure 2:
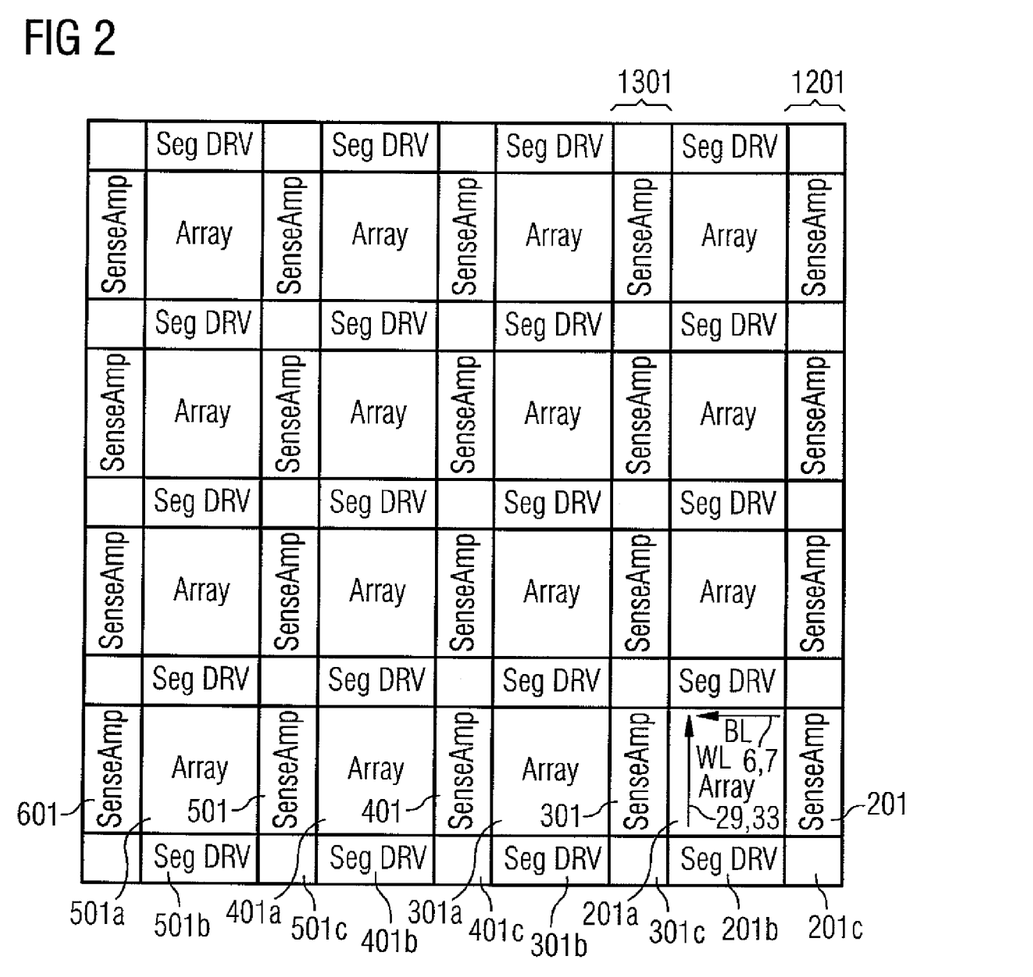
FIG. 2 illustrates a schematic representation of the structure of a section of the semiconductor memory device which may include the partial section illustrated in FIG. 1, with a plurality of array regions, sense amplifier regions, and segment driver regions.

As is illustrated in FIG. 2, the above-mentioned read or write/sense amplifier 1 may (along with a plurality of further read or write/sense amplifiers that are constructed similar or identical to the read or write/sense amplifier 1) be arranged in one of the plurality of corresponding sense amplifier regions 201, 301, 401, 501, 601 of the DRAM.

Furthermore, the above-mentioned memory cells 22a, 26a, 27a, 28a may be arranged in corresponding cell field regions 201a, 301a, 401a, 501a or array regions of the DRAM (wherein the memory cells 22a, 26a that are, in accordance with FIG. 1, arranged at the left side of the read or write/sense amplifier 1, are e.g., arranged in the cell field region positioned at the left of the respective sense amplifier regions 201, 301, 401, 501, 601, and wherein the memory cells 27a, 28a that are, in accordance with FIG. 1, arranged at the right side of the read or write/sense amplifier 1, are e.g., arranged in the cell field region positioned at the right side of the respective sense amplifier regions 201, 301, 401, 501, 601).

The above-mentioned local data lines 101, 102 are configured to be coupled with corresponding global data lines that—starting out from a corresponding column decoder region of the DRAM (not illustrated here)—may extend, for instance, substantially parallel to the above-mentioned bit lines 6, 7 (and many other, not illustrated bit lines BL) (and substantially rectangular to the above-mentioned word lines 29, 33, 30, 31 (and many other, not illustrated word lines WL)), and substantially parallel to the above-mentioned pairs of CSL control lines 105, 106 (and many other, not illustrated CSL control lines) through the above-mentioned sense amplifier regions 201, 301, 401, 501, 601 and the above-mentioned cell field regions 201a, 301a, 401a, 501a of the DRAM.

The above-mentioned word lines 29, 30, 31, 33 may each be controlled by control devices arranged in segment driver regions 201b, 301b, 401b, 501b or word line driver regions 201b, 301b, 401b, 501b, respectively.

Reference is now again made to FIG. 1. In order to read out data from, for instance, the memory cell 22a ("read access"), the access transistor 22 is connected through by activating the corresponding word line 33 (which results in a connecting through of all of the plurality of access transistors 22, etc. that are connected with the word line 33 and are arranged in one and the same row of the cell field region).

An "activate" or word line activate instruction serves, for instance, to activate the word line 33, that has previously been deactivated, for instance, by using a corresponding "precharge" or word line deactivate instruction.

Figure 3:
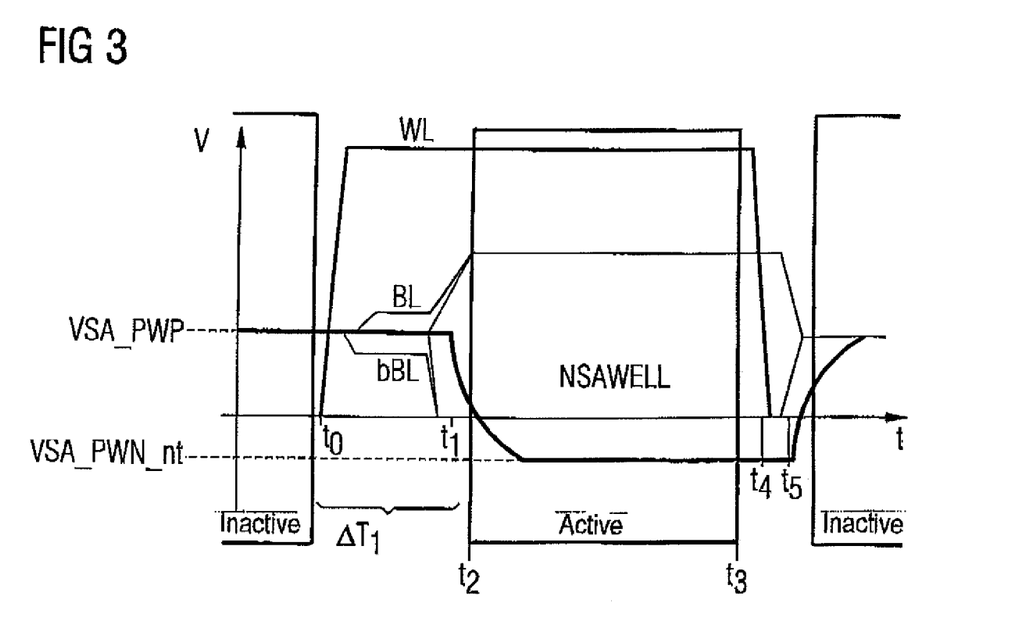
FIG. 3 illustrates a schematic timing diagram for illustrating the time progression of voltages/potentials used/occurring in the semiconductor memory device.

The activating of the word line 33 may, for instance, as illustrated in FIG. 3, be performed at a point in time $t_0$.

By the activating of the word line 33, i.e. the rise of the voltage WL present at the word line 33 from the point in time $t_0$ on, as illustrated in FIG. 3, the charge state stored in the capacitor 21 of the memory cell 22a is applied to the bit line 6, 7.

This results, as illustrated in FIG. 3, in a rise/drop of the voltage present at the bit lines 6, 7 (BL, bBL).

Then, e.g., at the point in time $t_2$ illustrated in FIG. 3, the above-mentioned read or write/sense amplifier 1 is activated, and thus the weak signal emanating from the capacitor 21 is amplified by the above-mentioned read or write/sense amplifier 1.

Prior to the reading out of a memory cell, bit line sections, i.e. sections of the non-complementary bit line 6 and of the complementary bit line 7, are precharged to the same potential by one of the above-mentioned precharge/equalize circuits 32, 14, which may, for instance, correspond to half the voltage of a bit line in the h-state (=VBLH/2).

Directly prior to the reading out of a memory cell, the precharge/equalize circuit 32, 14 is switched off.

As is illustrated in FIG. 1, the read or write/sense amplifier 1 is a "shared sense amplifier" that is used both during the reading out of a memory cell (e.g., the memory cell 22a) positioned at the left side and of a memory cell (e.g., the memory cell 28a) positioned at the right side along the above-mentioned bit lines 6, 7.

By using the above-mentioned isolation circuits 8, 9, the read or write/sense amplifier 1 is, during the reading out of a memory cell (e.g., the memory cell 22a), disconnected from the side/the bit line section that is not connected with the memory cells to be read out, and is coupled with the side/the bit line section that is connected with the memory cells to be read out (e.g., the memory cell 22a).

The actual reading out of the memory cell (e.g., the memory cell 22a) is initiated shortly thereafter, as mentioned above, by connecting through the corresponding access transistor (e.g., the transistor 22) that is connected with the corresponding capacitor (e.g., the capacitor 21), in that the corresponding word line (e.g., the word line 33) is activated.

Then, activation voltages are applied to the read or write/sense amplifier 1, whereupon the read or write/sense amplifier 1 amplifies the potential differences that are transmitted by the capacitor 21, and outputs an amplified differential signal.

The amplified differential signal is transmitted by the read or write/sense amplifier 1 to the above-mentioned pair of local data lines 101, 102.

In order to connect the above-mentioned pair of local data lines 101, 102 with the read or write/sense amplifier 1, the above-mentioned control signal CSL present at the CSL control lines 105, 106 is placed from a logic low in a logic high state, so that the corresponding transistors 103, 104 ("bit switches") are connected through.

The above-mentioned amplified differential signal is then transmitted to global data lines by the above-mentioned pair of local data lines 101, 102, and from there to a further amplifier ("secondary sense amplifier") for further amplification.

Subsequently, e.g., at the point in time $t_3$ or $t_5$ illustrated in FIG. 3, the above-mentioned read or write/sense amplifier 1 may be deactivated again.

Then, the above-mentioned control signal CSL present at the CSL control lines 105, 106 is placed from the above-mentioned logic high state in the above-mentioned logic low state again, so that the transistors 103, 104 ("bit switches") disconnect the above-mentioned pair of local data lines 101, 102 from the read or write/sense amplifier 1 again.

Subsequently, in one embodiment if a subsequent access relates to a memory cell that is assigned to another word line than the memory cell of the preceding access, the word line 33 may be deactivated again. A "precharge" or word line deactivate instruction serves to deactivate the word line 33.

The deactivating of the word line 33 may, for instance, as is illustrated in FIG. 3, be performed at a point in time $t_4$ and results, as is illustrated in FIG. 3, in a corresponding dropping of the voltage WL present at the word line 33.

In one embodiment, if a subsequent access relates to a memory cell that is assigned to the same word line 33 as the memory cell of the previous access, the word line 33 may (first of all) be left in the above-mentioned activated state.

In order to write data in a memory cell (e.g., the memory cell 22a) ("write access"), a process that is substantially inverse to the above-described process is carried out.

In brief, a corresponding differential signal is transmitted by the global data line to the pair of local data lines 101, 102.

Then, the above-mentioned control signal CSL present at the CSL control lines 105, 106 is placed from the above-mentioned logic low state in a logic high state, so that the transistors 103, 104 ("bit switches") are connected through.

Thus, the pair of local data lines 101, 102 is connected with the above-mentioned read or write/sense amplifier 1, and the above-mentioned differential signal present at the pair of local data lines 101, 102 is transmitted to the read or write/sense amplifier 1 (and then to the memory cell 22a that was selected by the activating of one of the above-mentioned word lines 33).

Then, the above-mentioned control signal CSL present at the CSL control lines 105, 106 is placed from the above-mentioned logic high state in the above-mentioned logic low state again, so that the transistors 103, 104 ("bit switches") disconnect the above-mentioned pair of local data lines 101, 102 from the read or write/sense amplifier 1 again.

As results from FIG. 3, in the present embodiment, for the transistors available in the read or write/sense amplifier 1 (here: e.g., the NMOS-FETs 2, 3 illustrated in FIG. 1 or the PMOS-FETs 4, 5 illustrated in FIG. 1), during the operation of the read or write/sense amplifier 1 or during the above-mentioned activation cycle (or the above-mentioned read cycle (and also during the above-mentioned write cycle)) a substrate potential NSAWELL that is adapted to be changed as explained in more detail further below is used (here e.g.: a relatively high e.g., a positive substrate potential VSA_PWP, and a relatively low e.g., a negative substrate potential VSA_PWN_nt).

As a positive substrate potential VSA_PWP, a voltage ranging, for instance, between +0.3 V and +0.9 V may be used, in one embodiment e.g., a voltage ranging between +0.4 V and +0.8 V, e.g., +0.5 V or +0.7 V, etc., for instance, the above-mentioned voltage VBLH/2 (i.e. half the voltage of a bit line in a logic high state).

As a negative substrate potential VSA_PWN_nt, a voltage ranging, for instance, between 0 V and −1.2 V may be used, in one embodiment e.g., a voltage ranging between 0 V and −1 V, e.g., −0.5 V, or, for instance, the ground potential, etc.

In one embodiment, as results from FIG. 3, (still) during the above-mentioned activated state of the word line 33 or (still) during the above-mentioned evaluation process, e.g., still prior to the beginning of the activating of the read or write/sense amplifier 1, or e.g., in one embodiment after the above-mentioned evaluation process or (shortly) after the activating of the read or write/sense amplifier 1, e.g., at a point in time $t_1$ illustrated in FIG. 3, it may be initiated that the substrate potential NSAWELL used for the transistors 2, 3, 4, 5 of the read or write/sense amplifier 1 changes from the above-mentioned, positive substrate potential VSA_PWP to the above-mentioned, negative substrate potential VSA_PWN_nt.

For triggering the change from the above-mentioned positive substrate potential VSA_PWP to the above-mentioned negative substrate potential VSA_PWN_nt, the "activate" or word line activate instruction causing the above-mentioned activation of the word line 33, but delayed by a period $\Delta T_1$ for triggering the change of the substrate potential, may be used.

For delaying the "activate" or word line activate instruction, appropriate delay members, e.g., inverters, etc. may, for instance, be used. In one embodiment, the delay members may be designed to be activatable and deactivatable by using conventional trimming methods, so that the actual duration of the above-mentioned delay period $\Delta T_1$ can be adjusted in an individually variable manner, i.e. be optimized correspondingly, for a corresponding DRAM.

In one embodiment, a control signal obtained by delaying the above-mentioned SAEN or SAEP signals or corresponding read or write/sense amplifier activation signals may, for instance, also be used for triggering the substrate potential change.

In one embodiment, as results from FIG. 3, at a relatively early time, e.g., even prior to or a long time prior to a (new) activation of the word line 33, e.g., at a point in time $t_5$ illustrated in FIG. 3, it may be initiated that the substrate potential NSAWLLL used for the transistors 2, 3, 4, 5 of the read or write/sense amplifier 1 changes, from the above-mentioned negative substrate potential VSA_PWN_nt, (back) to the above-mentioned positive substrate potential VSA_PWP (e.g., already shortly prior to or shortly after the expiration of the preceding activation cycle, e.g., shortly prior to or shortly after the above-mentioned deactivating of the word line 33 (point in time $t_4$) or of the read or write/sense amplifier 1 (point in time $t_3$), or as soon as the end of the preceding activation cycle can be recognized).

For triggering the change from the above-mentioned negative substrate potential VSA_PWN_nt to the above-mentioned positive substrate potential VSA_PWP, the "precharge" or word line deactivate instruction initiating the above-mentioned deactivation of the word line 33—but delayed by a period for triggering the change of the substrate potential may be used, or e.g., a delayed—"Bank Deselect" instruction, etc.

For delaying the instruction, appropriate delay members, e.g., inverters, etc. may, for instance, again be used. These may, as described above, in one embodiment be designed to be activatable and deactivatable by using conventional trimming methods, so that the actual duration of the above-mentioned delay period can be adjusted in an individually variable manner, i.e. be optimized for a DRAM.

Figure 4:
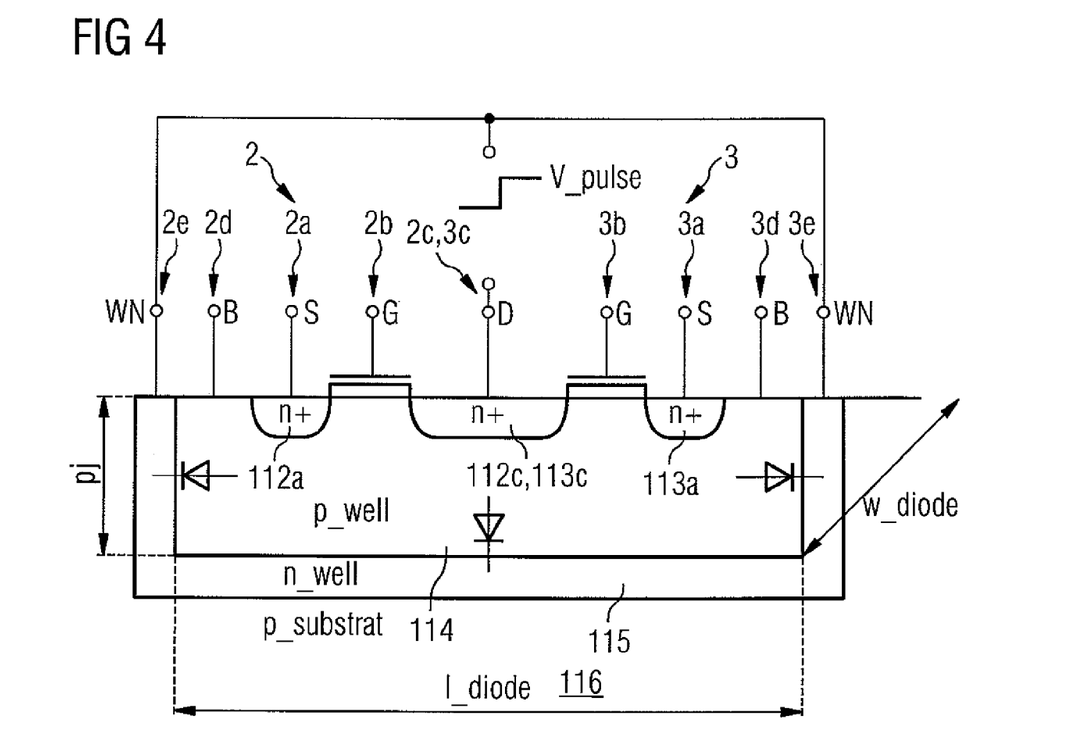
FIG. 4 illustrates a schematic sectional view of transistors used in the read or write/sense amplifier illustrated in FIG. 1.

FIG. 4 illustrates by way of example a schematic sectional view of transistors used in the read or write/sense amplifier 1 illustrated in FIG. 1 (there: the above-mentioned NMOS-FETs 2, 3).

They include source, gate, and drain connections 2a, 2b, 2c or 3a, 3b, 3c, and a bulk connection 2d or 3d each.

For forming the sources or drains of the transistors 2, 3 of the read or write/sense amplifier 1, n+ doped regions 112a, 112c or 113a, 113c are used, which are arranged in a p-doped well 114 acting as a substrate for the transistors 2, 3.

As results from FIG. 4, the p-doped well 114 is isolated from the remaining p-doped substrate 116 used on the DRAM by using an n-doped isolation layer 115 or an isolation well 115 that is possibly connected with a WN connection 2e or 3e, respectively.

Thus, it is possible, by applying voltages to the bulk connection 2d or 3d (or between the bulk connection 2d or 3d and the WN connection 2e or 3e), to generate the above-mentioned changeable, alternately positive and negative, substrate potentials VSA_PWP or VSA_PWN_nt for the transistors 2, 3 or 4, 5 available in the read or write/sense amplifier 1 (while a constant, unchanged substrate potential is, for instance, used for the above-mentioned p-doped substrate 116).

By the above-mentioned changing of the substrate potential of the transistors 2, 3 or 4, 5 available in the read or write/sense amplifier 1 it may, for instance, be achieved that the switch-over shift current resulting during the operation of the read or write/sense amplifier 1 at the connections 2a, 2b, 2c or 3a, 3b, 3c of the transistors 2, 3 or 4, 5, which is to be ascribed in one embodiment to corresponding transistor capacities, can be delivered from appropriate supply networks (e.g., VBLH or VBLL, etc.). Thus, it can be avoided that the bit line homogenization potential is disturbed.

Figure 5:
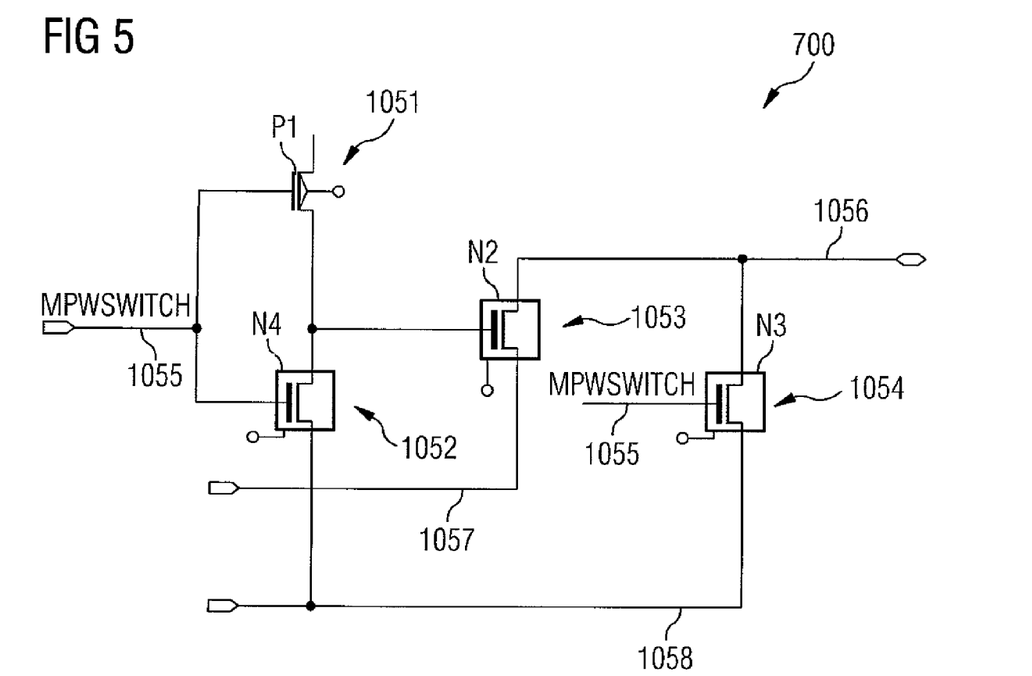
FIG. 5 illustrates a schematic exemplary representation of a circuit configured to be used for switching the read or write/sense amplifier substrate potential.

FIG. 5 illustrates by way of example a circuit 700 that can be used for the above-mentioned switching or changing of the read or write/sense amplifier substrate potential.

The circuit 700 may, for instance, as is illustrated in FIG. 2, be arranged in a intersection region 201c, 301c, 401c, 501c between a respective one of the above-mentioned segment driver regions 201b, 301b, 401b, 501b and a respective one of the above-mentioned sense amplifier regions 201, 301, 401, 501.

In one embodiment, the circuit 700 can locally control or switch the substrate potential of all the read or write/sense amplifiers 1 arranged in a corresponding sense amplifier region 201, 301, 401, 501.

In one embodiment, a circuit may also be used instead which does not only control locally the substrate potential of all the read or write/sense amplifiers 1 arranged in a sense amplifier region 201, 301, 401, 501, but globally the substrate potential of all the read or write/sense amplifiers arranged in a sense amplifier strip 1201, 1301 (i.e. the substrate potential of read or write/sense amplifiers arranged in a plurality of different sense amplifier regions 201, 301, 401, 501).

The circuit 700 may, again referring to FIG. 5, include, for instance, four transistors 1051, 1052, 1053, 1054, here: one PMOS-FET 1051, and three NMOS-FETs 1052, 1053, 1054.

One end of the source drain path of the PMOS-FET 1051 is connected with one end of the source drain path of the NMOS-FET 1052.

The other end of the source drain path of the NMOS-FET 1052 is connected to a line 1058.

Furthermore, the control connection of the PMOS-FET 1051 is connected to the control connection of the NMOS-FET 1052, and to a line 1055 to which a substrate potential change signal MPWSWITCH may be applied.

As results further from FIG. 5, the above-mentioned ends of the source drain paths of the PMOS and NMOS-FETs 1051, 1052 are furthermore connected to the control connection of the NMOS-FET 1053.

One end of the source drain path of the NMOS-FET 1053 is connected to a line 1056, and another end of the source drain path of the NMOS-FET 1053 is connected to a line 1057.

Correspondingly similar, one end of the source drain path of the NMOS-FET 1054 is also connected to the above-mentioned line 1056, and another end of the source drain path of the NMOS-FET 1054 is connected to the above-mentioned line 1058.

The control connection of the NMOS-FET 1054 is connected with the above-mentioned line 1055 to which, as explained, the above-mentioned substrate potential change signal MPWSWITCH can be applied.

To the above-mentioned lines 1057 or 1058, respectively different, constant voltages are applied, in one embodiment, for instance, to the line 1057 a first constant voltage that corresponds, for instance, to the above-mentioned substrate potential VSA_PWP illustrated in FIG. 3, and to the line 1058 a second different constant voltage that corresponds, for instance, to the above-mentioned substrate potential VSA_PWN_nt illustrated in FIG. 3 (or vice versa).

The line 1056 may, for controlling or changing the substrate potential of the read or write/sense amplifiers 1, be connected, for instance, with the bulk or WP connections of the read or write/sense amplifiers 1 illustrated in FIG. 4.

If the substrate potential is to be changed as explained above, e.g., at the point in time $t_1$ or $t_5$ illustrated in FIG. 3, a change of state of the substrate potential change signal MPWSWITCH present at the line 1055 is initiated, e.g., triggered by the above-explained instructions.

As results from the above statements, the above-mentioned substrate potential change signal MPWSWITCH is applied in a non-inverted manner (directly) to the control connection of the NMOS-FET 1054, and, in a manner inverted by the FETs 1051, 1052, to the control connection of the NMOS-FET 1053.

By the above-mentioned change of state of the substrate potential change signal MPWSWITCH present at the line 1055, the NMOS-FET 1054 is, for instance, placed from a locked state in a conductive state; furthermore, the PMOS-FET 1051 is placed from a conductive state in a locked state, and the NMOS-FET 1052 from a locked state in a conductive state, and thus the NMOS-FET 1053 from a conductive state in a locked state (or vice versa the NMOS-FET 1054 from a conductive state in a locked state; and the PMOS-FET 1051 from a locked state in a conductive state, the NMOS-FET 1052 from a conductive state in a locked state, and thus the NMOS-FET 1053 from a locked state in a conductive state).

In the locked state of the NMOS-FET 1053 and the conductive state of the NMOS-FET 1054, the line 1056 is conductively connected with the line 1058, and in the conductive state of the NMOS-FET 1053 and the locked state of the NMOS-FET 1054, the line 1056 is conductively connected with the line 1057.

By the above-mentioned change of state of the substrate potential change signal MPWSWITCH present at the line 1055 it is thus achieved that, at the line 1056, instead of the above-mentioned first voltage (present at the line 1057) the above-mentioned different second voltage (present at the line 1058) is then output, or vice versa, instead of the above-mentioned second voltage (present at the line 1058) the above-mentioned different first voltage (present at the line 1057) is output, so that either the above-mentioned relatively high, in one embodiment positive, or the above-mentioned relatively low, in one embodiment negative, substrate potential is generated at the corresponding read or write/sense amplifiers 1 (in one embodiment the above-mentioned substrate potentials VSA_PWP or VSA_PWN_nt illustrated in FIG. 3).

The above-mentioned method, in one embodiment the change of substrate potential described further above, may, in an identical manner or in a correspondingly similar manner as explained above, also be used, instead with the "shared sense amplifier" or shared read or write/sense amplifier 1 illustrated here by way of example, also with any other read or write/sense amplifiers, in one embodiment with "non-shared sense amplifiers" or non-shared read or write/sense amplifiers (which then comprise, for instance, no isolation circuits 8, 9), etc., and/or, instead with DRAMs, also with any other semiconductor memory devices, e.g., ROMs, for instance, PROMs, EPROMs, EEPROMs, etc., or, for instance, with flash memory devices, or with other types of RAMs than with DRAMs, e.g., with SRAMs, etc.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for operating a semiconductor device, comprising:
   providing at least one read or write sense amplifier comprising four transistors connected with each other in the manner of a flip-flop; and
   changing or controlling a substrate potential of the read or write sense amplifier including applying the same substrate potential to a substrate of the four transistors.

2. The method of claim 1, comprising changing the substrate potential in the course of an activation cycle or a read and/or write cycle, respectively.

3. The method of claim 1, comprising switching the substrate potential between a first predetermined potential and a second predetermined potential.

4. The method of claim 3, wherein the first predetermined potential is a positive potential, and the second predetermined potential is a negative potential.

5. The method of claim 3, wherein the first predetermined potential is a negative potential, and the second predetermined potential is a positive potential.

6. The method of claim 3, comprising switching the substrate potential from the second predetermined potential to the first predetermined potential shortly prior to or shortly after the end of an activation cycle.

7. The method of claim 3, comprising performing the switching from the second predetermined potential to the first predetermined potential as a function of the deactivating of a word line.

8. The method of claim 3, comprising performing the switching from the second predetermined potential to the first predetermined potential as a function of the deactivating of the read or write sense amplifier.

9. The method of claim 7, comprising performing the switching from the second predetermined potential to the first predetermined potential as a function of a precharge or word line deactivate instruction.

10. The method of claim 9, comprising triggering the switching from the second predetermined potential to the first predetermined potential by a signal that is delayed vis-à-vis the precharge or word line deactivate instruction.

11. The method of claim 3, comprising performing the switching from the second predetermined potential to the first predetermined potential as a function of a Bank Select instruction.

12. The method of claim 3, comprising performing the switching of the substrate potential from the first predetermined potential to the second predetermined potential during an activated state of a word line assigned to the read or write/sense amplifier.

13. The method of claim 3, comprising performing the switching from the first predetermined potential to the second predetermined potential as a function of the activating of the read or write/sense amplifier.

14. A semiconductor memory device, comprising:
   at least one read or write sense amplifier with a substrate potential that is configured to be changed in the course of an activation cycle or a read and/or write cycle, respectively,
   wherein the at least one read or write sense amplifier comprises four transistors connected with each other in the manner of a flip-flop, and
   wherein the same substrate potential is applied to a substrate of the four transistors.

15. The semiconductor memory device of claim 14, wherein the read or write/sense amplifier or part of the read or write sense amplifier is arranged in a substrate that is isolated vis-à-vis a further substrate of the semiconductor memory device.

16. The semiconductor memory device of claim 15, wherein the four transistors of the read or write sense amplifier are arranged in the isolated substrate.

17. The semiconductor memory device of claim 16, wherein at least one of the four transistors is/are NMOS or PMOS-FETs.

18. The semiconductor memory device of claim 17, wherein one or a plurality of bulk connections of at least one of the four transistors is/are connected to a voltage switching circuit.

19. The semiconductor memory device of claim 14, wherein the substrate potential is adapted to be switched between a first predetermined potential and a second predetermined potential.

20. The semiconductor memory device of claim 19, wherein the substrate potential is adapted to be switched between the first predetermined potential and the second predetermined potential by a voltage switching circuit; and
   wherein the voltage switching circuit is arranged in an intersection region between a sense amplifier region and a segment driver region of the semiconductor memory device.

21. A semiconductor memory device, comprising:
   at least one read or write sense amplifier with a substrate potential that is configured to be changed in the course of an activation cycle or a read and/or write cycle, respectively; and
   means for changing the substrate potential,
   wherein the at least one read or write sense amplifier comprises four transistors connected with each other in the manner of a flip-flop, and
   wherein the same substrate potential is applied to a substrate of the four transistors.

* * * * *